United States Patent [19]

Huang et al.

[11] Patent Number: 5,671,119
[45] Date of Patent: Sep. 23, 1997

[54] PROCESS FOR CLEANING AN ELECTROSTATIC CHUCK OF A PLASMA ETCHING APPARATUS

[75] Inventors: Yuan-Chang Huang, Hsin-Chu; Shzh-Kuei Yen, Hsin-pu, both of Taiwan

[73] Assignee: Taiwan Semiconductor Manufacturing Company, Ltd., Hsin-Chu, Taiwan

[21] Appl. No.: 620,184

[22] Filed: Mar. 22, 1996

[51] Int. Cl.$^6$ .................................................. H02N 13/00
[52] U.S. Cl. ........................................................ 361/234
[58] Field of Search ........................ 15/104.002, 223; 361/233, 234; 269/8, 903; 279/128

[56] References Cited

U.S. PATENT DOCUMENTS

| 5,310,453 | 5/1994 | Fukasawa et al. | 156/643 |
| 5,382,311 | 1/1995 | Ishikawa et al. | 156/345 |
| 5,507,874 | 4/1996 | Su et al. | 134/1 |

*Primary Examiner*—Fritz Fleming
*Attorney, Agent, or Firm*—George O. Saile; William J. Stoffel

[57] ABSTRACT

A method of cleaning an electrostatic chuck, wherein a soft, particle adherent, sheet of material is affixed to a dummy wafer. The dummy wafer is then placed on the electrostatic chuck, and DC power applied to the chuck electrode to build up an electrostatic force between the chuck and wafer. After the power is turned off, the wafer and sheet of material with the adhered particle contamination is removed.

7 Claims, 2 Drawing Sheets

PROCESS FOR CLEANING AN ELECTROSTATIC CHUCK OF A PLASMA ETCHING APPARATUS

BACKGROUND OF THE INVENTION

1. Field of the Invention

The present invention relates to semiconductor processing, more specifically to cleaning plasma etching apparatus used in semiconductor processing.

2. Description of the Related Art

In semiconductor device manufacturing, various types of plasma processes are used to deposit layers of conductive and dielectric material on semiconductor wafers, and also to blanket etch and selectively etch materials from the wafer. During these processes the wafer is affixed to a wafer chuck in a process chamber and a plasma generated adjacent the wafer surface. Various techniques have evolved to affix the wafer to the wafer chuck. A recent technique for holding the wafer is using an electrostatic chuck, as described in U.S. Pat. Nos. 5,310,453 and 5,382,311. In an electrostatic chuck, a conductive electrode beneath a dielectric wafer support layer is provided. When a high DC voltage is applied to the electrode, positive and negative charges are respectively produced in the wafer and the electrode, so that the wafer is attracted and held on the chuck surface by the Coulomb force acting between the wafer and the electrode. Plasma etching is performed in this state. When the etching is completed, the supply of RF power and the application of the high DC voltage to the electrode are terminated. Subsequently, the processed wafer is unloaded. The electrostatic chuck eliminates the need for mechanical clamp rings, and greatly reduces the probability of forming particles by abrasion etc., which particles cause yield problems and require frequent cleaning of the apparatus.

During the etching process, the temperature of the wafer must be controlled to prevent non-uniform etching which would otherwise produce and adverse effect on the wafer. The etch rate increases with temperature increases. This temperature control can be achieved by improving the heat transfer rate between the wafer and wafer chuck. A heat transfer gas, such as He, is supplied to grooves in the top surface of the chuck. The grooves in combination with the wafer form chambers when a wafer is affixed to the chuck.

Even though the use of an electrostatic chuck reduces particle contamination, it is inevitable that small particles are formed, and other contamination generated within the process chamber. These particles and contamination when deposited or formed on the wafer chuck surface of an ESC increase the leakage of the heat transfer gas, i.e. He, at the interface of the chuck surface and wafer. This leakage reduces the temperature control of the wafer and the efficiency of wafer cooling techniques. Consequently, the process chamber and the wafer chuck must be cleaned quite frequently. This results in down time for the apparatus, and requires an expensive and time consuming manual apparatus cleaning operation.

SUMMARY OF THE INVENTION

It is an object of the invention to provide a new and more efficient process for cleaning an electrostatic chuck.

Another object of the invention is to provide a new process for removing small particles and other contamination from the top surface of an electrostatic chuck.

Yet another object of the invention is to provide a method of cleaning an electrostatic chuck of a plasma etching apparatus that takes a minimum amount of time, and is less disruptive of the overall semiconductor manufacturing operation.

In accordance with the above objectives, there is provided a process for cleaning an electrostatic chuck of a plasma apparatus in which a flexible, soft sheet of material is affixed to the backside of a dummy wafer, and the dummy wafer is placed on the wafer chuck in the process chamber with the sheet of material positioned between the chuck and wafer. A source of DC power is applied to the chuck electrode within the wafer chuck that is sufficient to build up a high electrostatic force between the wafer and wafer chuck. The DC power is turned off, and the dummy wafer and sheet of material, along with the adhered particles and contamination, are removed.

DETAILED DESCRIPTION OF THE PREFERRED EMBODIMENTS

The accompanying drawings, which are incorporated in and constitute a part of the specification, illustrate preferred embodiments of the invention and serve to explain the principles of the invention.

DETAILED DESCRIPTION OF THE PREFERRED EMBODIMENTS

Figure 1:
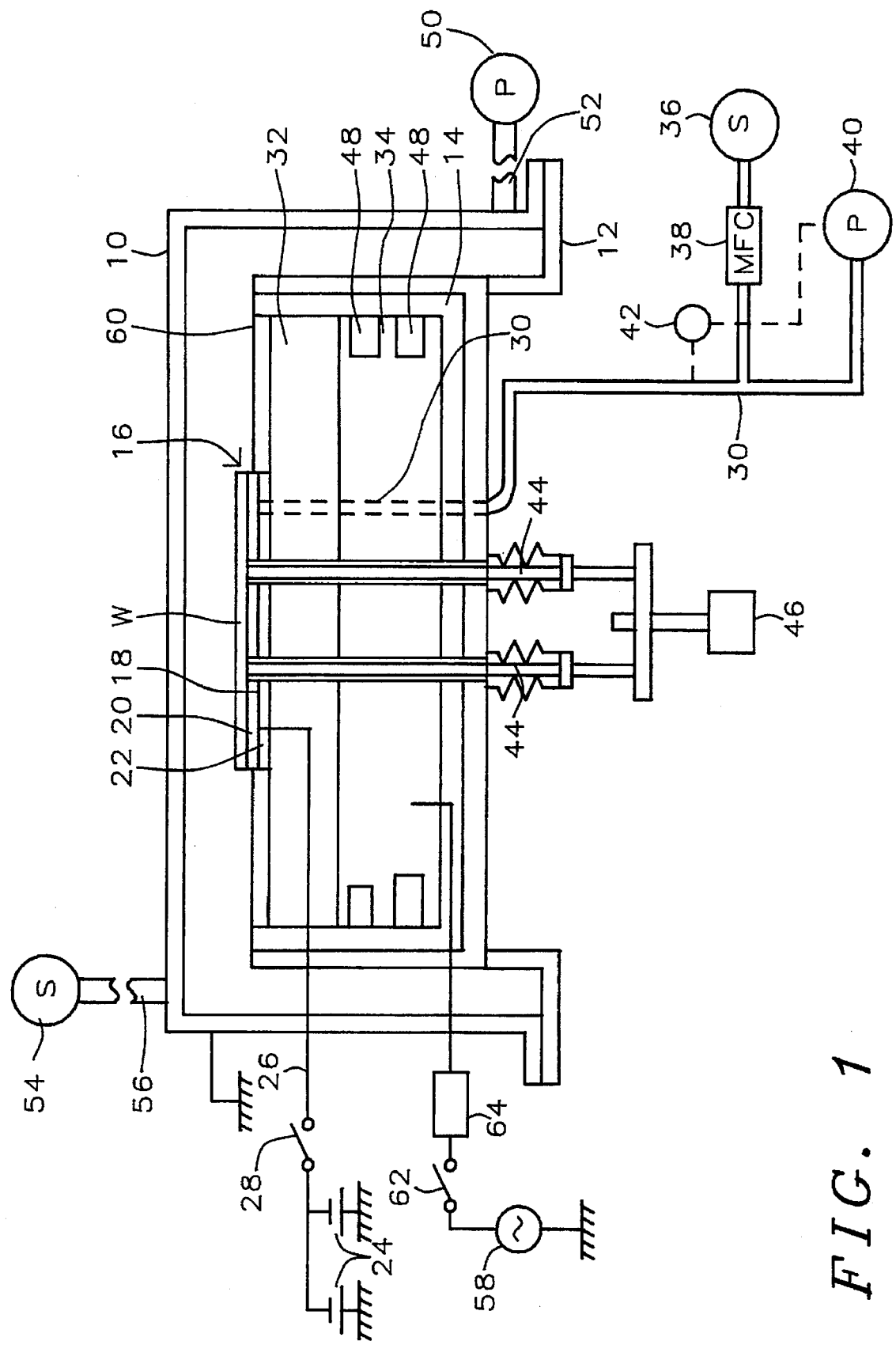
FIG. 1 is a schematic view of a typical plasma etching apparatus on which the process of the invention can be performed.

Referring now to FIG. 1 of the drawing, there is depicted a plasma etching apparatus, provided with an electrostatic chuck (ESC), which is typical of the apparatus which can be cleaned by applicants process.

The apparatus has a process chamber made up of an upper case 10, and a lower case 12, The upper and lower cases are made of a conductive material, such as aluminum. The lower case 12 has a cylindrical shape with a bottom so that an insulating ceramic frame 14 can be fitted therein. An electrostatic chuck 16 has a conductive sheet 18, serving as a chuck electrode, that is sandwiched between upper and lower dielectric sheets 20 and 22, preferably made of polyimide. A DC power source 24 is connected to chuck electrode 18 through a feeder path 26 and switch 28. When a high voltage is applied to electrode 18 from power source 24 a Coulomb force is generated between wafer W and electrode 18 which attracts and holds the wafer W on the ESC 16.

In order to improve the heat transfer between the wafer W and the ESC 16, a heat medium, such as He, is supplied between the wafer and ESC 16. The heat transfer gas is supplied through a line 30 extending through the ESC 16, the ceramic frame 14, and plates 32 and 34. Line 30 is connected to a gas source 36 through a mass flow controller 38. In addition, a vacuum pump 40, having a variable exhaust conductance, is connected to line 30. Pump 36 is controlled by a pressure controller 42 for detecting the internal pressure of line 30. Line 30 is connected to grooves (not shown) in the top surface of dielectric sheet 20 of ESC 16.

A plurality of pusher pins 44 that extend through ESC 16, plates 32 and 34, ceramic frame 14, and lower case 12 are provided for lifting the wafer W off the ESC 16. The pins are moved to the extended or withdrawn position by motor 46.

Preferably, susceptor 34 is provided with a cooling jacket 48 to cool the wafer W. A vacuum pump 50 is connected to process chamber, through pipe 52, to exhaust gas from the chamber. A source 54 of etching gas is connected to chamber through pipe 56. The upper case 10 is grounded, and an RF power source 58 is connected to susceptors 32 and 34, and conductive plate 60. A switch 62 and an impedance tuner 64 control the power supplied by RF power source 58.

Figure 2:
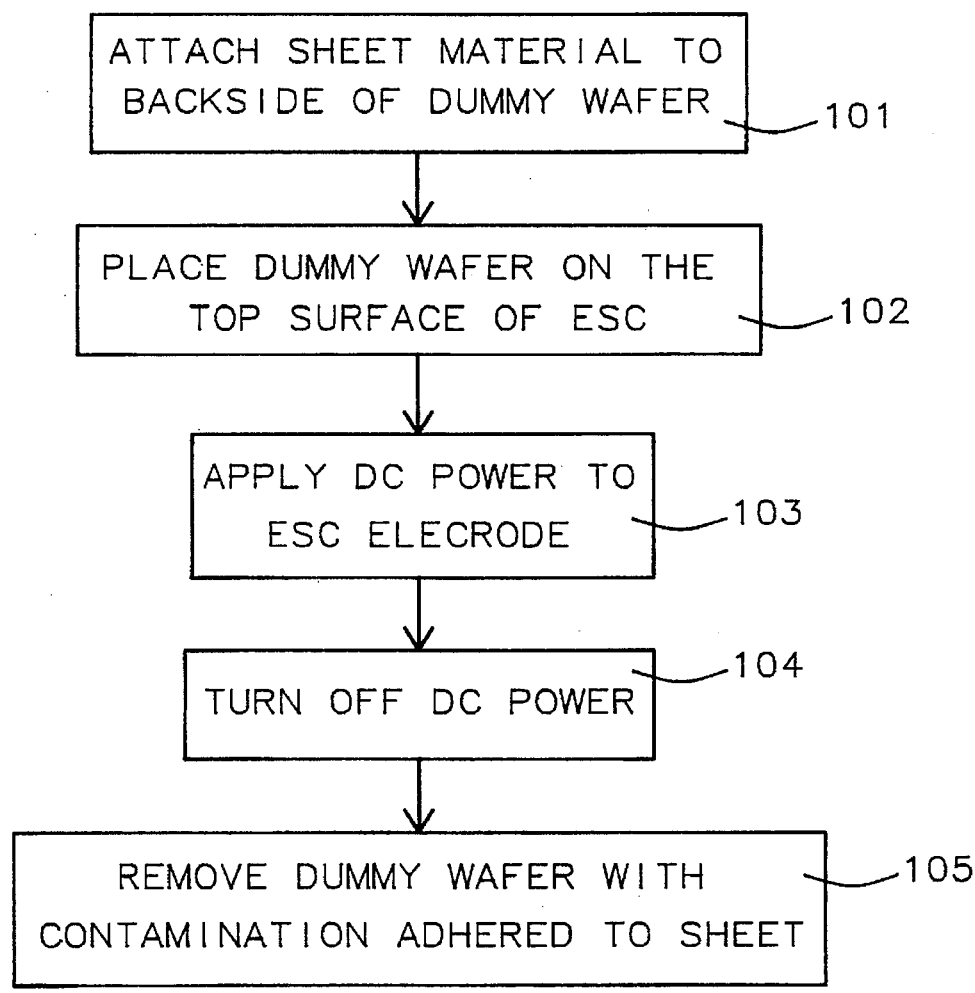
FIG. 2 is a flow diagram that depicts the process steps of the subject invention.

Referring now to FIG. 2 of the drawings, there is depicted a flow chart which sets forth the process steps of the invention for cleaning debris and contamination from an ESC of the type shown in FIG. 1, and described above. The debris to be removed consists mainly of small particles of semiconductor material that has been inadvertently broken off wafers being processed. However dust particles and other extraneous material can also become lodged on the vacuum chuck. In addition, other contamination may be deposited on the ESC from photoresist residue, polymer generation during the plasma etch process, hardware erosion, such as AL $Cl_3$ powder, and the like.

The ESC is very sensitive to particle contamination on the surface of the wafer support surface. Particles and debris may change the electrostatic field distribution between the wafer and chuck. The larger the gap between the wafer and the chuck, the smaller is the effect of the electrostatic force. Thus, the wafer can not be stuck to the chuck if the electrostatic force is too low. The gap between wafer and chuck is typically in the micron range. Further, the presence of particle contamination will cause higher He leakage, non-uniform wafer temperatures, and varying process performance, i.e. non-uniform etching rates etc. The back side helium flow cooling is based on the assumption of smooth contact surfaces between the chuck surface and wafer surface. The lower the He leak rate, the better the cooling efficiency. The back side He leak rate can be used as an index for the back side cooling efficiency.

Presently the ESC is cleaned by pump purging for at least 60 times. This procedure takes at least 90 minutes and is frequently ineffective. Another cleaning technique is to wet clean the chuck. This procedure takes at least four hours and requires the process chamber to be opened.

In the cleaning process of the invention, the process chamber need not be opened, in automated process applications, and the time required for cleaning is minimal.

In the process of the invention for cleaning an ESC, a soft flexible sheet of material is affixed to the backside of a dummy semiconductor wafer as indicated by block 101 in FIG. 2. The sheet of material is preferably shaped to the shape of the dummy wafer. Any suitable sheet material can be used that will cause particles and contamination to stick or adhere to it in preference to the chuck. The material thickness is preferably in the range of 0.05 mm to 0.5 mm. A preferred soft, flexible, plastic sheet material is sold under the trademark of KAPTON, which is readily available from Fralock, a division of Lockwood Industries Inc, at 21054 Osborne Street, Canoga Park, Calif. 922304.

The sheet of material can be stuck to the dummy wafer by any suitable method. KAPTON is a tape-like material with one side more sticky than the other side. The sticky side of the sheet is pressed to the backside of the wafer, making sure that there are no bubbles between the wafer and the KAPTON sheet. Other suitable technics include applying a coating of a polyimide film directly on the backside of the dummy wafer, preferably using a vacuum grease to improve the adhesion between the film and the wafer. In general, the preferred materials will be soft plastic polymer materials which can be used in a vacuum environment without giving off any type of substance. The materials are insulating materials that are non-porous, soft, vacuum-acceptable, flexible, and will adhere small particles when the film is pressed against the particles.

The dummy wafer and sheet of material is then placed in the process chamber on the wafer chuck with the sheet of material on the bottom side of the wafer in contact with the top surface of the ESC. This step is indicated by block 102 in FIG. 2. The chamber is closed and preferably evacuated and the DC power applied to the chuck electrode as indicated by block 103. The RF power is not applied. The DC power draws the dummy wafer against the chuck electrode wherein the particles and contamination is caused to preferentially stick to the sheet of material. The DC power is left on a suitable time, preferably for a time in the range of 60 to 120 seconds, and more generally for a time exceeding 60 seconds. The DC power is then turned off as indicated by block 104 and the dummy wafer with the sheet material removed from the process chamber, as indicated by block 105. The sheet material with the particles and contamination can be removed from the dummy wafer, and the dummy wafer re-used.

A process wafer is then placed on the chuck electrode and processed. After the air has been evacuated, the source of DC power and the inert gas is applied to the chuck electrode. The gas leakage can be monitored to check the cleanliness of the chuck electrode surface. If the leakage is higher than the normal leakage with a clean chuck surface, the cleaning process should be repeated. The leakage is an indicator of the cleanliness of the chuck surface.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A process for cleaning debris and contamination from the surface of an electrostatic chuck of a plasma etching apparatus having a process chamber, a source of RF power, an electrostatic wafer chuck within the process chamber, a chuck electrode, and a source of DC power connected to said chuck electrode comprising;

attaching a flexible, soft sheet of material to the backside of a dummy semiconductor wafer, placing the dummy wafer on the electrostatic wafer chuck within the process chamber with the sheet of material in direct contact with the wafer chuck, applying a source of DC power to the chuck electrode that is sufficient to build up a high electrostatic force between the wafer and wafer chuck, terminating the DC power to the chuck electrode, and removing the dummy wafer and contamination debris that are stuck to the sheet of material.

2. The method of claim 1 wherein said sheet of material has a thickness in the range of 2.5 to 3.5 mil.

3. The method of claim 2, wherein said sheet of material is a sheet of soft, flexible plastic material.

4. The method of claim 3 wherein the sheet of material is tailored to a shape that corresponds to the shape of the dummy wafer.

5. The method of claim 1, Wherein said soft sheet of material is a sheet of soft plastic polymer material.

6. The method of claim 5, wherein said sheet of plastic polymer material is a polyimide film.

7. The method of claim 6, wherein vacuum grease is used to improve the adhesion of the sheet of polyimide material to the wafer.

* * * * *